US006995612B1

(12) United States Patent
Chen

(10) Patent No.: US 6,995,612 B1
(45) Date of Patent: Feb. 7, 2006

(54) CIRCUIT FOR REDUCING CURRENT MIRROR MISMATCH DUE TO GATE LEAKAGE CURRENT

(75) Inventor: Yen-Chung T. Chen, Sunnyvale, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 78 days.

(21) Appl. No.: 10/736,344

(22) Filed: Dec. 15, 2003

(51) Int. Cl.
*H03F 3/04* (2006.01)

(52) U.S. Cl. ...................................... 330/288; 330/277

(58) Field of Classification Search ..................... None

See application file for complete search history.

(56) References Cited

U.S. PATENT DOCUMENTS

| | | | | |
|---|---|---|---|---|
| 4,835,487 | A * | 5/1989 | Doyle et al. | 330/288 |
| 5,124,632 | A * | 6/1992 | Greaves | 330/288 |
| 6,107,883 | A * | 8/2000 | Xu | 330/255 |
| 6,714,080 | B2 * | 3/2004 | Burns | 330/288 |

* cited by examiner

*Primary Examiner*—Khanh V. Nguyen
(74) *Attorney, Agent, or Firm*—Hamilton & Terrile, LLP; Gary W. Hamilton

(57) ABSTRACT

A current mirror that compensates for the effects of gate current leakage related to quantum mechanical tunneling of electrons. An embodiment of the current mirror of the present invention comprises a first reference current leg, first and second current mirror legs and a load leg. Current compensation devices are operable to provide current compensation components to offset the effects of gate current leakage. In one embodiment of the invention the current compensation components comprise P-type CMOS transistors.

20 Claims, 8 Drawing Sheets

CIRCUIT FOR REDUCING CURRENT MIRROR MISMATCH DUE TO GATE LEAKAGE CURRENT

BACKGROUND OF THE INVENTION

1. Field of the Invention

The present invention relates in general to the field of current mirrors used in integrated circuits. More specifically, the present invention provides an improved current mirror that compensates for the effects of current mismatch related to gate leakage in semiconductor devices.

2. Description of the Related Art

A current mirror is a current source that generates an output current that is controlled by an input reference current. Current mirrors are employed in a wide variety of applications where it is necessary to have an accurate, reliable current source. Current mirrors are particularly useful for accurately replicating a reference current source at multiple locations in a circuit.

Many of the advances in size reduction of complimentary metal oxide semiconductor (CMOS) transistors in integrated circuits in recent years have been based on the concept of scaling. The scaling concept is based on the theory that a large CMOS transistor can be "scaled" to produce a smaller CMOS transistor having similar operational characteristics. One of the limitations to the scaling concept, however, relates to the phenomenon of quantum mechanical tunneling of electrons through very thin gate oxide layers. In deep submicron design, gate oxide thickness is scaled essentially to a few layers of silicon atoms. Therefore, direct tunneling currents become significant factors in operation of circuits such as current mirrors. Direct tunneling currents in the CMOS components used to implement a current mirror can become so pronounced that the reference and the mirrored output currents are no longer equal, thereby destroying the benefit of using a current mirror.

Because of the current mismatches that can result in a current mirror due to gate leakage currents in CMOS circuit components, there is a need for an improved current mirror that is capable of compensating for the effects of gate current leakage.

SUMMARY OF THE INVENTION

The present invention overcomes the shortcomings of the prior art by providing a current mirror that compensates for the effects of gate current leakage related to quantum mechanical tunneling of electrons. The current mirror of the present invention comprises a first reference current leg, first and second current mirror legs and a load leg. In the present invention, current compensation devices are operable to provide current compensation components to offset the effects of gate current leakage. In one embodiment of the invention the current compensation devices comprise P-type CMOS transistors.

In an embodiment of the present invention, the current mirror comprises a first reference leg operable to provide a reference current that is passed through an N-type CMOS reference transistor connected in a diode configuration. A first mirror leg of the current mirror comprises a first P-type CMOS transistor and a first N-type CMOS transistor. A second mirror leg of the current mirror comprises a second P-type CMOS transistor and a second N-type CMOS transistor. Finally, a load leg of the current mirror comprises a third P-type CMOS transistor that delivers the output current to a load. Current leakage through the gates of the P-type CMOS transistors in the first and second current mirror legs and in the output load leg is compensated by first and second P-type compensation transistors that compensate for leakage currents through the gates of the P-type CMOS transistors in the first, second and the load mirror legs.

The method and apparatus of the present invention is not limited to a single current source, but it can also be applied to multiple current sources as well. The applications of the present invention are broad and can be used to improve the performance in virtually all circuits that incorporate current mirror circuits. For example, in one embodiment of the present invention, the load leg of the circuit provides a source current to a charge pump circuit in a phase-locked loop. In this embodiment, the load is composed of switches, a loop filter capacitor and a current sink. Without compensating for gate leakage current as provided by the present invention, the pump up and pump down currents would be mismatched, resulting in a significant phase offset that is highly undesirable.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
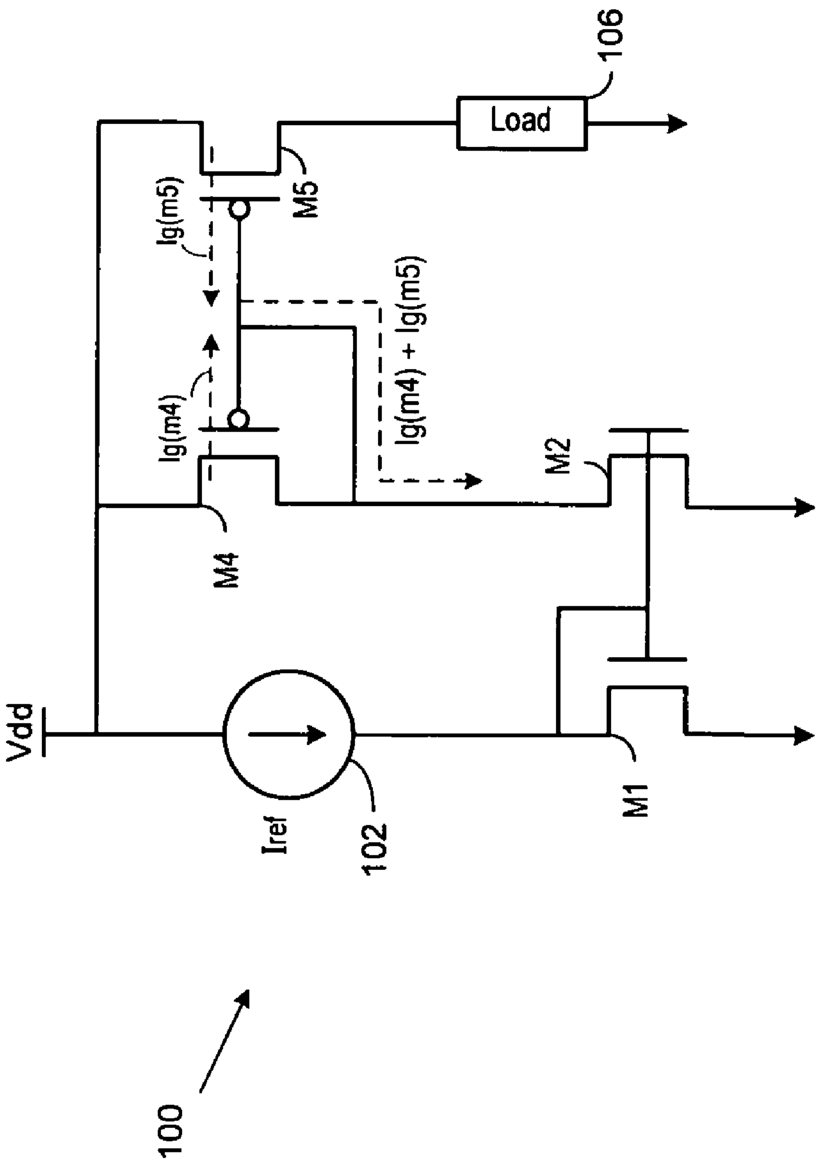
Figure 1 (Prior Art)
FIG. 1 is an illustration of a prior art current mirror with gate leakage.

FIG. 1 is an illustration of a prior art current mirror. The current mirror 100 includes a reference leg comprising a reference current source 102 and an N-type CMOS transistor M1 that is connected in a diode configuration. A first "mirror" leg of the current mirror 100 comprises an N-type CMOS transistor M2 that has its gate tied to the gate of transistor M1 and a P-type CMOS transistor M4 that has its source connected to Vdd and its drain connected to transistor M2. As illustrated in FIG. 1, the gate and drain of transistor M4 are connected in a diode configuration. The load leg of the current mirror 100 comprises a P-type CMOS transistor M5 that has its gate coupled to the gate of transistor M4 and its drain connected to load 106.

As will be understood by those skilled in the art, current mirrors of the type illustrated in FIG. 1 are designed to generate an output current through the load 106 in the load leg that is matched or often a precisely-controlled ratio to the reference current 102 in the reference leg. More specifically, in a typical 1:1 current mirror, Id(M5)=Id(M1)=$I_{ref}$=$I_{load}$ if channel length modulation and gate leakage (direct tunneling) currents are ignored. As discussed hereinabove, however, the prior art current mirror illustrated in FIG. 1 is susceptible to the effects of gate leakage in the CMOS devices, especially the P-type MOS transistors M4 and M5. Therefore, direct tunneling currents become so pronounced that the reference current and the load current are no longer equal. As illustrated in FIG. 1, gate current leakage through the gate of transistor M4 creates a net gate current Ig(M4) that will flow through the diode connection of transistor M4. In addition, gate current leakage through the gate of transistor M5 results in a net gate current Ig(M5) that flows through the gate of transistor M5. Therefore:

$$Id(M4)=Id(M2)-Ig(M4)-Ig(M5).$$

Id(M5), the mirrored current source will in turn copy the current of Id(M4). Specifically:

$$Id(M5)=Id(M2)-Ig(M4)-Ig(M5).$$

In practice, P-type CMOS devices are often sized to be larger than the N-type CMOS counterparts to achieve similar output swing. In addition, for applications that demand wide output swing range, P-type CMOS devices can be sized quite large. Therefore, the direct tunneling currents can become significant and can cause substantial current mismatch.

In the present invention, it is possible to neglect channel length modulation since this effect can be reduced by using transistors having longer channel lengths or by employing circuit techniques such as cascoding and/or regulation. It is also possible to ignore all gate leakage currents associated with N-type CMOS transistors because gate leakage in these devices has a negligible impact in the context of the present invention.

Figure 2:
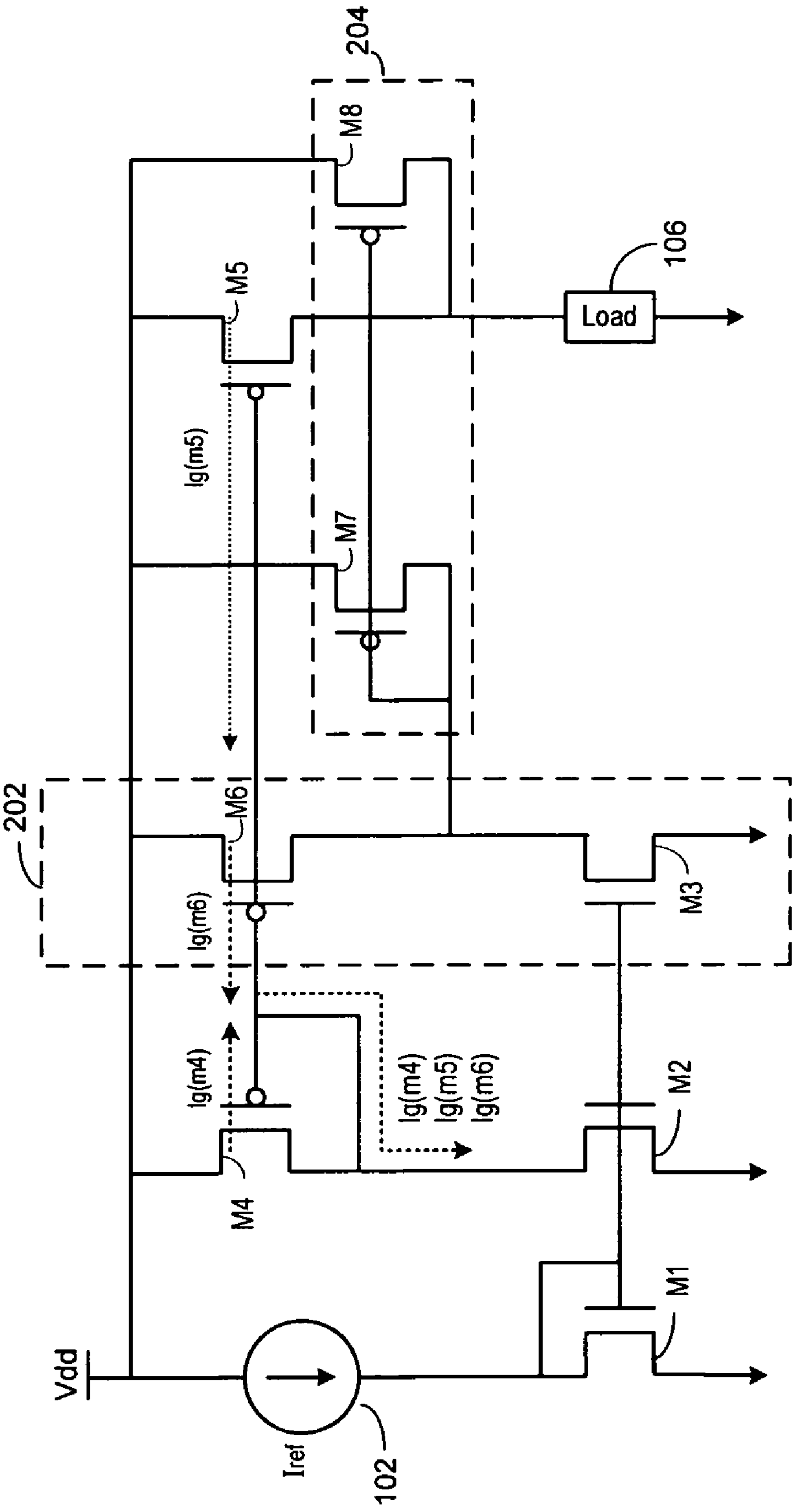
FIG. 2 is an illustration of an embodiment of the current mirror of the present invention for compensating for the effects of gate leakage.

In an embodiment of the present invention illustrated in FIG. 2, a second current mirror leg 202 comprising N-type CMOS transistor M3 and P-type CMOS transistor M6 is added. In addition, two compensating P-type CMOS transistors M7 and M8 are added. Transistors M7 and M8 can be relatively small since their primary function is to compensate for gate leakage currents. For this reason, the gate leakage current for the compensating P-type CMOS transistors M7 and M8 can be ignored. The smallest dimensions of the compensating devices are limited by 1) the fabrication process steps which ensure that M7 and M8 can be reasonably matched, and 2) performance parameters that ensure that transistors M7 and M8 can supply the needed compensating currents without causing any devices in the circuit to fall out of the saturation region of operation.

In the present invention, transistor M7 is connected in a diode configuration and is operable to sense and to supply the amount of current lost by gate leakage due to Ig(M4), Ig(M5), and Ig(M6). Transistor M8 then copies the current of M7 and the copied current is added back to the load leg of the current mirror.

As illustrated in the following equations, the current mismatch of prior art current mirrors is eliminated by the present invention:

$$*\mathrm{Id}(M1)=Id(M2)=Id(M3)=Iref$$

$$*\mathrm{Id}(M4)=Id(M2)-Ig(M4)-Ig(M5)-Ig(M6)=Id(M5)=Id(M6);$$

*Since Id(M3)=Id(M6)+Id(M7)=Id(M2)−Ig(M4)−Ig(M5)−Ig(M6)+Id(M7) and Id(M3)=Id(M2).

*Therefore, Id(M7)=Ig(M4)+Ig(M5)+Ig(M6)=Id(M8) =>gate leakage has been compensated.

Figure 3:
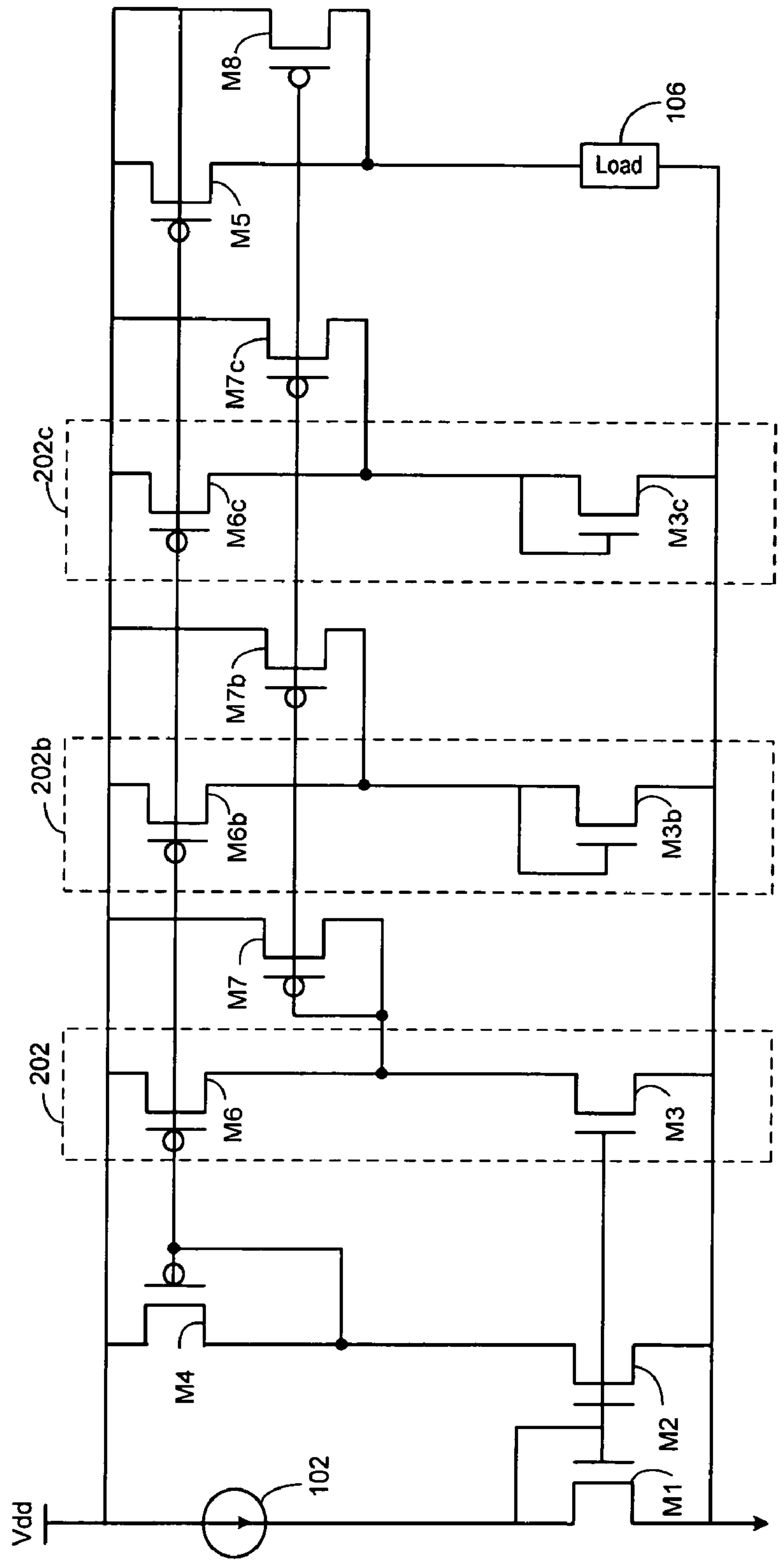
FIG. 3 is an illustration of another embodiment of the present invention for compensation for the effects of gate leakage in a system for mirroring multiple sources.

The compensation technique described above is not limited to duplicating a single current source, but it can also be applied to duplicating multiple current sources as well. FIG. 3 is an illustration of a current mirror for duplicating multiple current sources with additional output current mirror legs and gate leakage compensation circuitry. In the embodiment illustrated in FIG. 3, additional output current mirror legs 202*b* and 202*c* are added. Each of these current mirror legs includes a P-type CMOS transistor and a diode connected N-type CMOS transistor posing as the output load for illustration purpose. Referring to FIG. 3, current mirror leg 202*b* comprises P-type CMOS transistor M6*b* and N-type transistor M3*b*. Likewise, current mirror leg 202*c* comprises P-type transistor M6*c* and N-type transistor M3*c*. In addition, current compensation transistors are added to compensate for the gate leakage in the P-type transistors in each of the current mirror legs. Specifically, P-type transistors M7*b*, M7*c*, and M8 are operably connected to compensate for the gate current leakage due to P-type transistors in the respective current mirror legs.

Figure 4:
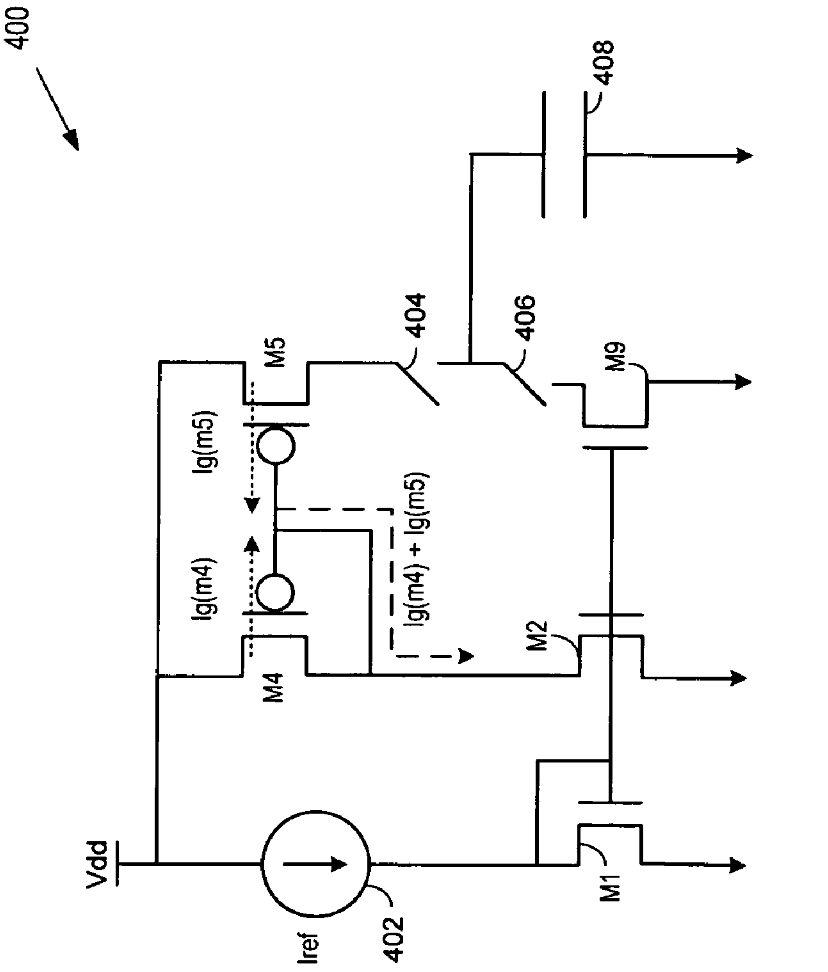
FIG. 4 is an illustration of a current mirror circuit used in conjunction with a charge pump circuit in a phase-locked loop.

The present invention can be used to compensate for the effects of gate leakage in virtually any circuit that incorporates current mirror circuits. FIG. 4 is an example of a current mirror circuit used in conjunction with a charge pump circuit in a phase-locked loop. In the embodiment illustrated in FIG. 4, the current mirror 400 includes a reference leg comprising a reference current source 402 and an N-type CMOS transistor M1 that is connected in a diode configuration. The mirror leg comprises an N-type CMOS transistor M2 that has its gate tied to the gate of transistor M1 and a P-type CMOS transistor M4 that has its source connected to Vdd and its drain connected to transistor M2. As illustrated in FIG. 4, the gate and drain of transistor M4 are connected in a diode configuration. The load leg of the current mirror 400 comprises a P-type CMOS transistor M5, the "pump up" current source, and an N-type CMOS transistor M9, the "pump down" current sink. The switches 404 and 406 are opened and closed in a coordinated sequence to direct "pump up" and "pump down" current to the filter capacitor 408 in a phase-locked loop in a manner understood by those of skill in the art. The P-type transistors M4 and M5 are susceptible to the effects of gate current leakage as discussed hereinabove. Without proper compensation for gate current leakage, the pump-up and pump-down current would be mismatched, thereby resulting in a significant phase offset that is highly undesirable in a phase-locked loop.

Figure 5:
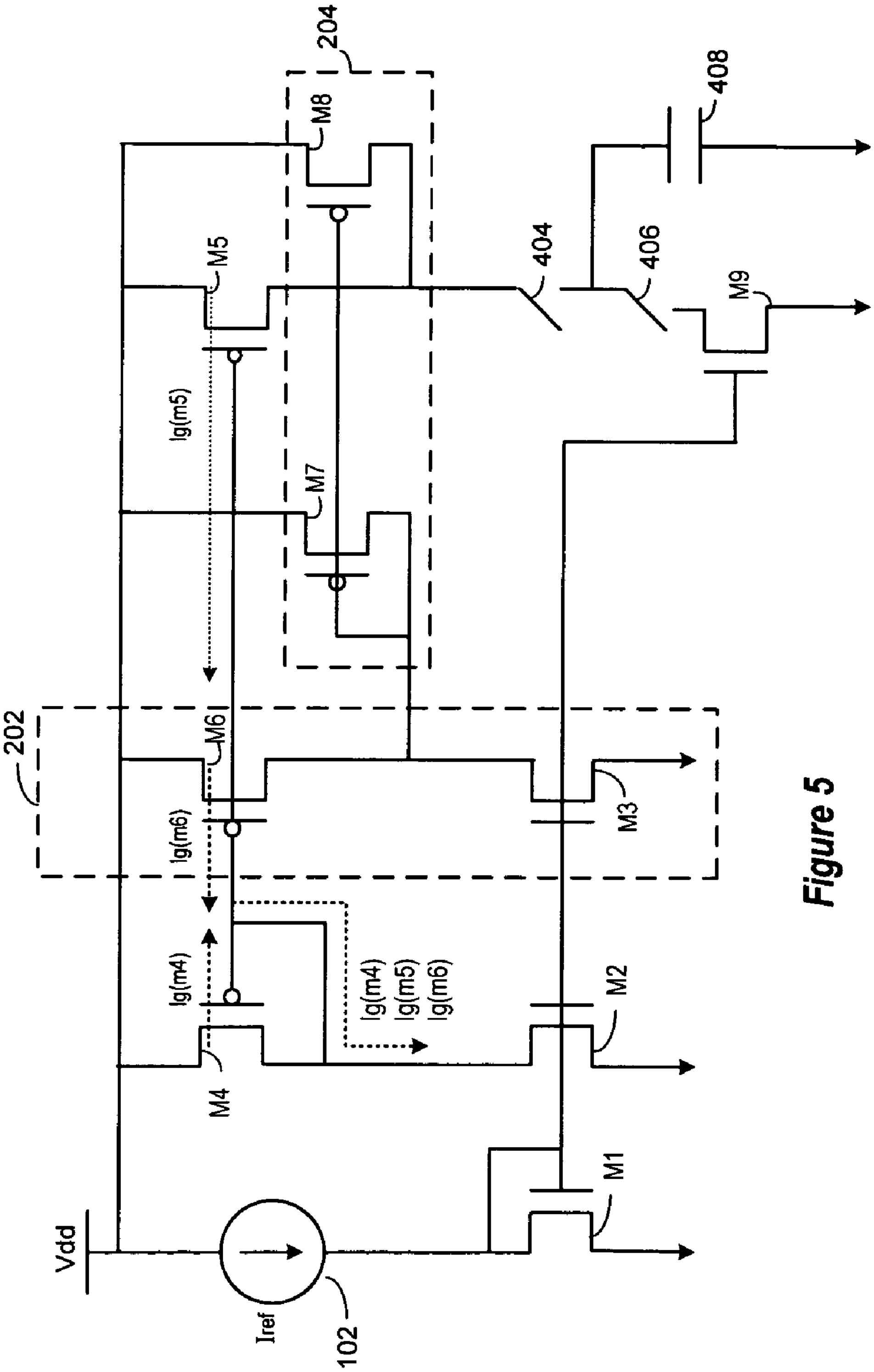
FIG. 5 is an illustration of the improved current mirror of the present invention used in conjunction with a charge pump circuit in a phase-locked loop.

FIG. 5 is an illustration of a current mirror circuit for use with a phase-locked loop in accordance with the present invention. In the embodiment illustrated in FIG. 5, the charge pump circuit comprises a "pump up" current source realized by M5 and a "pump down" current sink realized by M9, the switches 404, 406, and the load capacitor 408 discussed above. The other circuit components illustrated in FIG. 5 comprise the circuit elements discussed hereinabove in connection with FIG. 2. In operation, the circuit illustrated in FIG. 5 ensures that the undesirable effects of current leakage in the P-type CMOS transistors is compensated and, therefore, the mismatch between pump-up and pump-down currents are reduced to avoid significant phase offset that is highly undesirable in the phase-locked loop.

Figure 6A:
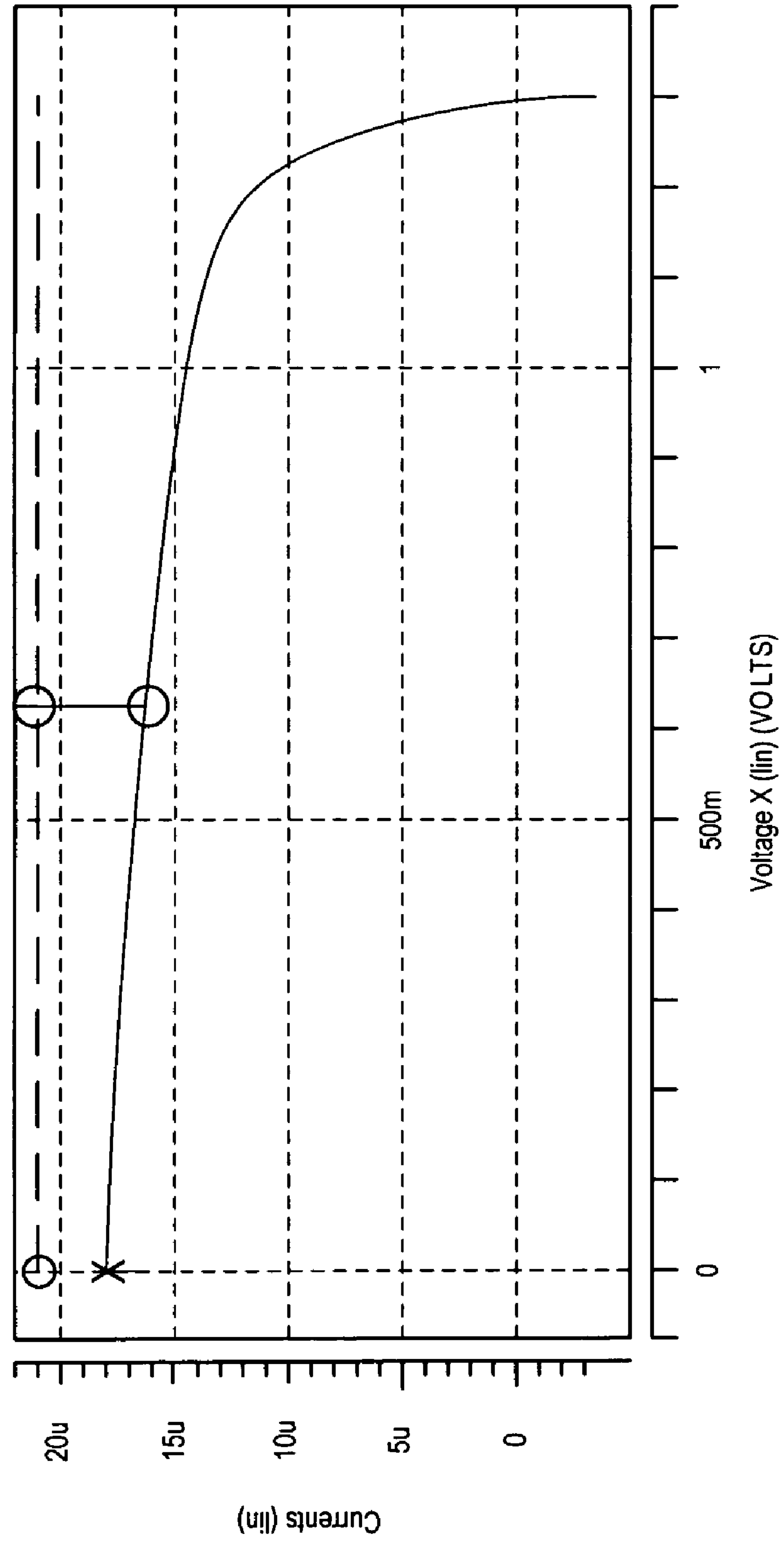
FIG. 6A is an illustration of the performance characteristics of a prior art current mirror that is susceptible to the effects of gate leakage.
Figure 6B:
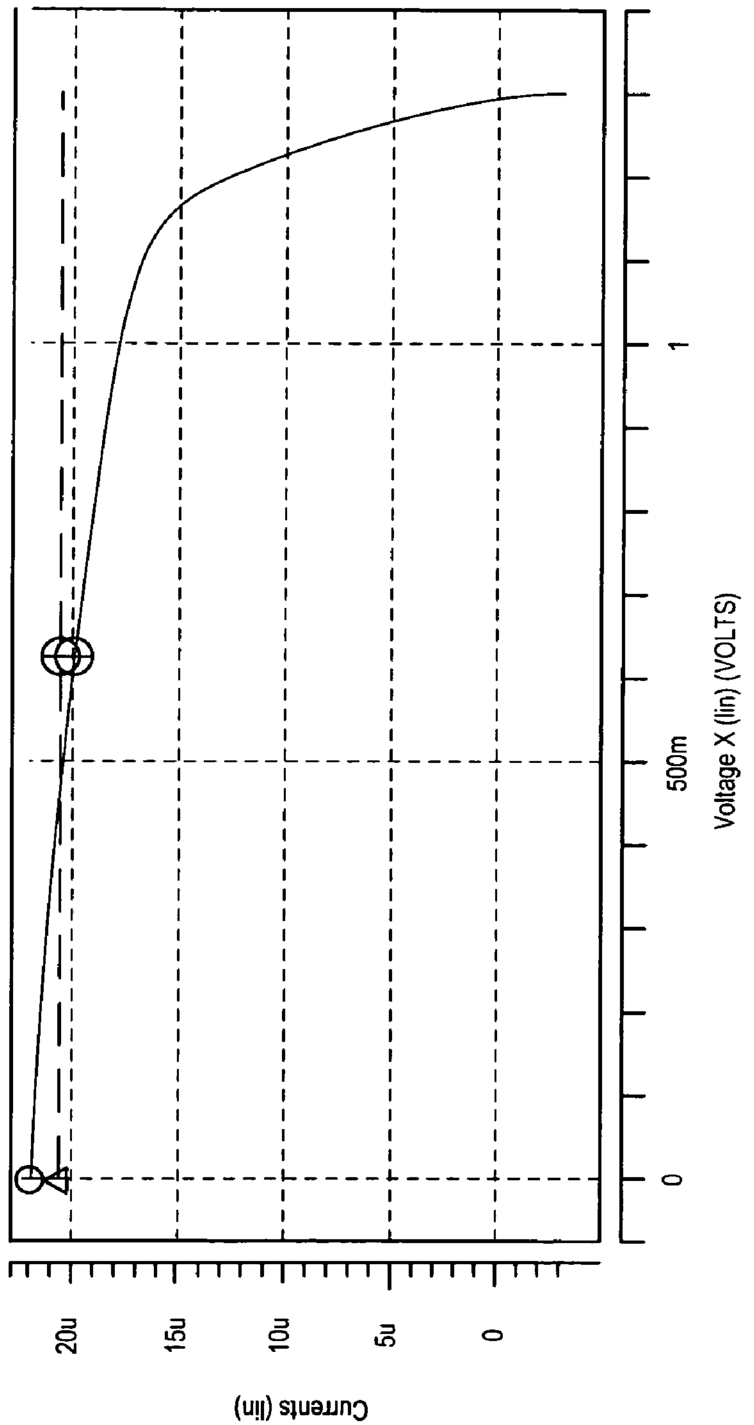
FIG. 6B is an illustration of the performance characteristics of the current mirror of the present invention illustrated in FIG. 2.
Figure 6C:
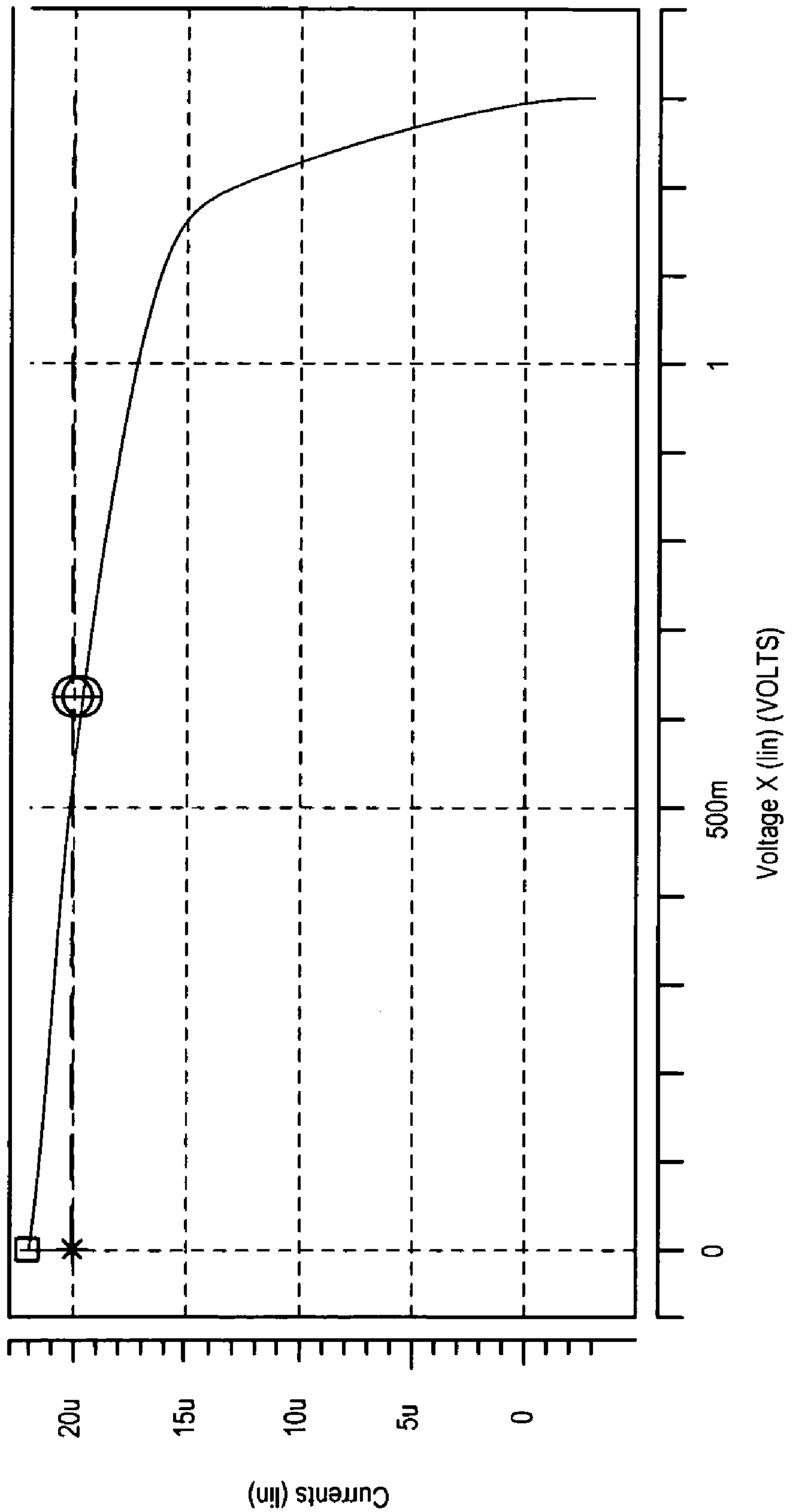
FIG. 6C is an illustration of the performance characteristics of the current mirror of the present invention illustrated in FIG. 3.

Operation of the present invention has been verified by performing simulations for each of the configurations discussed herein. Three configurations of the current mirror of the present invention have been simulated to verify operation of the present invention. FIG. 6A illustrates the effect of current mismatch due to gate leakage in a prior art current mirror. FIG. 6B illustrates improvement related to the current compensation of the present invention for a current mirror comprising a second mirror leg and gate leakage compensation. Finally, FIG. 6*c* illustrates the improvement related to the multiple current source embodiment of the invention illustrated in FIG. 3.

Although the present invention has been described in detail, it should be understood that various changes, substitutions and alterations can be made hereto without departing from the spirit and scope of the invention as defined by the appended claims.

What is claimed is:

1. A current mirror, comprising:

a first leg comprising a reference current source operable to generate a reference current;

a first mirror current leg comprising a first P-type CMOS transistor and a first N-type transistor;

a second mirror current leg comprising a second P-Type CMOS transistor and a second N-type transistor;

a load leg comprising a third P-type transistor and a load; and compensation circuitry operable to compensate for gate current leakage in said first, second and third P-type CMOS transistors.

2. The current source according to claim 1, wherein said reference current is passed through an N-type CMOS transistor connected in a diode configuration.

3. The current mirror according to claim 1, wherein said compensation circuitry comprises first and second P-type compensation transistors.

4. The current mirror according to claim 3, wherein said first compensation transistor is connected in a diode configuration and is operable to sense and provide a portion of a reference current that is lost due to gate current leakage of said first, second and third P-type CMOS transistors.

5. The current mirror according to claim 4, wherein said second P-type compensation transistor generates a compensation current equal to the portion of the reference current that is lost due to the gate current leakage of said first, second and third P-type CMOS transistors.

6. The current mirror according to claim 5, wherein said load comprises a charge pump circuit for a phase-locked loop.

7. The current mirror according to claim 5, wherein said current mirror comprises at least three output current sources.

8. The current mirror according claim 7, wherein current mirror comprises a first sensing transistor in a diode configuration and at least three compensation devices to compensate for gate current leakage in said first, second and third P-type CMOS transistors.

9. The current mirror according to claim 8, wherein said compensation devices comprise P-type CMOS transistors.

10. The current mirror according to claim 9, wherein said three output current sources each comprise at least one P-type CMOS transistor and wherein said compensation devices compensate for gate current leakage in said P-type CMOS transistors.

11. A method of operating a current mirror circuit having a reference leg, first and second mirror legs each comprising a P-type CMOS transistor and a N-type transistor, and a load leg comprising P-type CMOS transistor and a load comprising:

generating a reference current in said reference leg of said current mirror circuit;

using said reference current to control the flow of current in said first and second mirror legs and said load leg of said current mirror circuit;

compensating for gate current leakage in said P-type CMOS transistors in said first and second mirror legs and the load leg, thereby generating a current flow in said load leg equal to the current flow in said reference leg.

12. The method according to claim 11, wherein said reference current is passed through an N-type CMOS transistor connected in a diode configuration.

13. The method according to claim 12, wherein said compensation comprises first and second P-type compensation transistors.

14. The method according to claim 13, wherein said first compensation transistor senses and generates a compensation current equal to the sum of all gate current leakage through the diode connection of the first P-type CMOS transistor in the first mirror leg of said all P-type CMOS transistors.

15. The method according to claim 14, wherein said second P-type compensation transistor copies the compensation current from the first P-type compensation transistor and adds the compensation current to a mismatched output current.

16. The method according to claim 15, wherein said load comprises a charge pump circuit for a phase-locked loop.

17. The method according to claim 15, wherein said current mirror comprises at least three output current source legs.

18. The method according claim 17, wherein said current mirror comprises at least three compensation devices plus the very first sensing compensation device to compensate for gate current leakage in said all legs containing a P-type CMOS transistor.

19. The method according to claim 18, wherein said compensation devices comprise P-type CMOS transistors.

20. The method according to claim 19, wherein said three output current source legs each comprise at least one P-type CMOS transistor and said three current compensation devices each provide compensation for all of said P-type CMOS transistors.

* * * * *